US006263559B1

(12) United States Patent
Mimura et al.

(10) Patent No.: US 6,263,559 B1
(45) Date of Patent: Jul. 24, 2001

(54) ELECTRONIC COMPONENT MOUNTING METHOD AND APPARATUS

(75) Inventors: Yoshihiro Mimura, Izumi; Noriaki Yoshida, Ikeda; Osamu Okuda, Hirakata, all of (JP)

(73) Assignee: Matsushita Electric Industrial Co., Ltd., Osaka-fu (JP)

( * ) Notice: Subject to any disclaimer, the term of this patent is extended or adjusted under 35 U.S.C. 154(b) by 0 days.

(21) Appl. No.: 09/670,691

(22) Filed: Sep. 28, 2000

Related U.S. Application Data

(62) Division of application No. 09/094,982, filed on Jun. 15, 1998, now Pat. No. 6,158,117.

(30) Foreign Application Priority Data

Jun. 16, 1997 (JP) .................................................... 9-158936

(51) Int. Cl.⁷ ............................ B23P 21/00; B23Q 15/00
(52) U.S. Cl. ............................ 29/721; 29/720; 29/739; 29/740; 29/741; 29/743; 29/833; 29/834; 29/832; 700/9; 700/90
(58) Field of Search ............................ 29/721, 720, 739, 29/740, 741, 743, 833, 834, 832, 830, 827, 825; 700/9, 11, 12, 13, 14, 15, 90, 91, 28, 44, 52, 54, 71, 83, 95, 114, 115, 117, 245, 302

(56) References Cited

U.S. PATENT DOCUMENTS 4,628,646 * 12/1986 McConnell ............................ 364/513
4,862,510 * 8/1989 Duncan et al. ............................ 382/8
4,950,011 8/1990 Borcea et al. .
5,131,139 * 7/1992 Oyama et al. ............................ 29/721
5,140,643 * 8/1992 Izumi et al. ............................ 382/8
5,224,262 7/1993 Takaichi et al. .................... 29/721 X
5,285,888 * 2/1994 Izume et al. ........................ 198/471.1
5,377,405 1/1995 Sakurai et al. ...................... 29/833 X
5,541,834 7/1996 Tomigashi et al. ............. 364/167.01
5,570,993 11/1996 Onodera et al. .
5,724,722 3/1998 Hashimoto .............................. 29/740
5,729,895 3/1998 Kim .................................. 29/833 X
5,741,114 4/1998 Onodera .
5,926,950 7/1999 Asai et al. .......................... 29/832 X

FOREIGN PATENT DOCUMENTS 0 471 272   2/1992   (EP) .

OTHER PUBLICATIONS

Database WPI, Section PQ, Week 9820, Derwent Pub. Ltd., London, GB; Class P56, AN 98–227134, XP002078740 & JP 10 070 397 A (Yamagata Casio KK) (Abstract).

* cited by examiner

Primary Examiner—Valencia Martin-Wallace
Assistant Examiner—Binh-An Nguyen
(74) Attorney, Agent, or Firm—Wenderoth, Lind & Ponack, L.L.P.

(57) ABSTRACT

The behavior of a nozzle tip is measured with a jig when the suction nozzle moves vertically and rotatively before the start of production. The nozzle tip displacement is formulated from the results with a component thickness and a mounting angle used as parameters, and the parameters are corrected according to the component thickness and the final mounting angle of the electronic component to be mounted in the production stage.

7 Claims, 15 Drawing Sheets

Fig.10

| MOUNTING BLOCK | MOUNTING POSITION X | MOUNTING POSITION Y | MOUNTING ANGLE θ | COMPONENT SUPPLY POSITION Z | MARK DATA |
|---|---|---|---|---|---|
| 1 | $X_1$ | $Y_1$ | $\theta_1$ | $Z_1$ | 1 |
| 2 | $X_2$ | $Y_2$ | $\theta_2$ | $Z_2$ | 1 |
| 3 | $X_3$ | $Y_3$ | $\theta_3$ | $Z_3$ | 3 |
| 4 | $X_4$ | $Y_4$ | $\theta_4$ | $Z_4$ | 2 |
| ... | ... | ... | ... | ... | ... |
| n | $X_n$ | $Y_n$ | $\theta_n$ | $Z_n$ | m |
| ... | ... | ... | ... | ... | ... |

Fig.11

| MARK DATA NUMBER | MARK 1 | | MARK 2 | |
|---|---|---|---|---|
| | X | Y | X | Y |
| 1 | $X_{M1}(1)$ | $Y_{M1}(1)$ | $X_{M2}(1)$ | $Y_{M2}(1)$ |
| 2 | $X_{M1}(2)$ | $Y_{M1}(2)$ | $X_{M2}(2)$ | $Y_{M2}(2)$ |
| ⋮ | ⋮ | ⋮ | ⋮ | ⋮ |
| m | $X_{M1}(m)$ | $Y_{M1}(m)$ | $X_{M2}(m)$ | $Y_{M2}(m)$ |
| ⋮ | ⋮ | ⋮ | ⋮ | ⋮ |

ELECTRONIC COMPONENT MOUNTING METHOD AND APPARATUS

This application is a Divisional Application of Ser. No. 09/094,982, filed Jun. 15, 1998, now U.S. Pat. No. 6,158,117.

BACKGROUND OF THE INVENTION

The present invention relates to a component mounting method and apparatus for automatically mounting components onto a circuit board.

An example of the construction of a prior art generic electronic component mounting apparatus is shown in FIG. 7, and a flowchart of its operation control sequence is shown in FIG. 8. With reference to these FIGS. 7 and 8, a prior art electronic component mounting method will be described.

As shown in FIG. 9, a plurality of mounting patterns 2a, 2b, 2c, etc. and target marks 3a, 3b, 3c, etc. are formed on a circuit board 1, and the production of the circuit board is performed by mounting a desired electronic component on the mounting patterns 2a, 2b, 2c, etc. In this case, the target marks 3a, 3b, 3c, etc. are used for correcting the mounting positions which delicately vary on every circuit board 1 depending on a contraction of the circuit board occurring in calcining the mounting patterns 2 on the circuit board 1, and depending on the state in which the circuit board 1 is supported by a circuit board positioning device 4.

The production of the circuit board by means of the electronic component mounting apparatus is performed firstly by forming mounting data from the mounting pattern of the circuit board 1 to be produced (Step #1). FIG. 10 shows an example of the mounting data. Further, a positional relation between the mounting patterns and the target marks of the circuit board for reference use is detected and mark data is formed (Step #2). FIG. 11 shows an example of the mark data.

According to these various data, a specified number of circuit boards are produced. A production procedure is to firstly bring the circuit board 1 from a board conveyance section 5 into a circuit board positioning device 4 (Step #3). Next, a board image pickup device 6 is aligned in position with the desired target mark 3a, 3b, 3c, etc. of the circuit board 1 from above to pickup the image of the target mark 3a, 3b, 3c, etc. and the target mark position of the circuit board 1 is detected. According to this image pickup result, the mounting position and the angle are corrected (Step #4).

Subsequently, the electronic component mounting head 7 is moved onto a component supply device 8 (component supply units 8a or 8b) by an XY robot 20 including an X-direction driving unit 20x for moving the head 7 in an X direction and two Y-direction driving units 20y for moving the X-direction driving unit 20x and the head 7 in a Y direction perpendicular to the X direction. Then, a suction nozzle 9 ofthe head 7 is positioned in a component supply position, and the desired electronic component corresponding to the mounting data is sucked (Step #5). In this case, the vertical and rotative movements of the suction nozzle 9 in the electronic component mounting head 7 are achieved by a mechanism as shown in FIG. 12, where the suction nozzle 9 moves vertically while being interlocked with a shaft 10 and the vertical movement is effected with an actuator 11 used as a drive source. In this stage, a locus of the shaft 10 when it moves vertically is regulated by a nut 12 and a nut 13. Further, the suction nozzle 9 rotates while being interlocked with the shaft 10, and its rotative movement is effected with an actuator 15 used as a drive source via a belt 14.

Next, the electronic component mounting head 7 is moved so that the sucked electronic component is positioned above a component image pickup device 16, and the suction posture of the electronic component sucked by the suction nozzle 9 is detected by the component image pickup device 16. Based on this image pickup result, the final mounting position and angle of the electronic component are determined (Step #6).

Finally, by positioning the electronic component mounting head 7 so that the electronic component is positioned in the obtained mounting position on the circuit board and moving the suction nozzle 9 downward, the mounting of the electronic component is performed (Step #7).

Thus one circuit board is produced by repetitively performing such a series of sucking and mounting operations according to the preparatorily formed mounting data, and it is determined whether or not the production of the circuit board has been completed at this point of time (Step #8). When the production has been completed, the circuit board is brought out of the circuit board positioning device 4 to the board conveyance section 5 (Step #9). When the production has not been. completed, the sucking and mounting operations of the next electronic component will be achieved. (Steps #5 through #7).

However, the shaft 10 has a bending attributed to the processing accuracy as shown in FIG. 13. Accordingly, a displacement of average 5–10 $\mu$m (increasing toward the nozzle tip in relation to the nut 13) occurs when the shaft 10 is moved vertically by the actuator 11. The suction posture of the electronic component is detected by the component image pickup device 16, and the suction nozzle 9 is moved down for the mounting of the electronic component in the mounting position on which the image pickup result is reflected. Therefore, the displacement of average 5–10 $\mu$m occurs at the nozzle tip and this causes a problem in that the electronic component cannot be mounted in the desired mounting position. 10% or more of all recognition errors might be due to the displacement.

In this case, it can be considered to make the component recognition height equal to the mounting height for the purpose of preventing the displacement of the nozzle tip. In this case, it is required to first move the suction nozzle 9 up after recognizing the component, and thereafter move the nozzle down for the achievement of mounting. Therefore, a worthless vertical movement of the suction nozzle 9 occurs, thereby reducing productivity. Then, in order to eliminate the worthless vertical movement of the suction nozzle 9, the mounting height is generally set below the component recognition height so that the suction nozzle 9 can be moved down from the recognition height after the recognition of the component directly to the mounting height for the achievement of the mounting of the electronic component.

Further, when a rotative deviation occurs through the detection of the suction posture of the electronic component by the component image pickup device 16, the shaft 10 is to be rotated by the actuator 15 to correct the deviation. In this stage, as shown in FIG. 14, a rotative displacement attributed to the bending of the shaft 10 occurs at the suction nozzle tip, and therefore, a further displacement occurs.

SUMMARY OF THE INVENTION

In view of the aforementioned conventional issues, the present invention has an object to provide a component mounting method and apparatus capable of achieving a high mounting accuracy without reducing the productivity even with the existence of the bending of the shaft which vertically and rotatively moves while being interlocked with the suction nozzle.

In accomplishing these and other aspects, according to a first aspect of the present invention, there is provided a component mounting method. The method includes determining at a specified position a circuit board on which a component is to be mounted, sucking a component from a component supply device by a suction nozzle which is mounted on a head section and is able to move vertically and rotatively picking up by an image pickup device an image of the component sucked by the suction nozzle, inspecting a sucked state of the component by analyzing the captured image using a recognition control device, and mounting the component to the specified position on the circuit board while correcting a mounting position according to a result of inspection. The method further includes capturing by the image pickup device a rotary posture of a suction nozzle tip surface when the suction nozzle rotatively moves, before the component is mounted onto the circuit board. A displacement of the suction nozzle tip surface is inspected when the suction nozzle rotatively moves. Finally, the mounting position of the component is corrected in a mounting stage according to the displacement of the suction nozzle tip surface.

According to a second aspect of the present invention, there is provided a component mounting method according first aspect, wherein rotary postures of a suction nozzle tip surface when the suction nozzle moves rotatively and vertically are captured by the image pickup device, before the component is mounted onto the circuit board. In addition, the displacements of the suction nozzle tip surface are inspected when the suction nozzle moves rotatively and vertically.

According to a third aspect of the present invention, there is provided a component mounting method according to the second aspect, wherein displacements of the suction nozzle tip surface at a plurality of angles of rotation of the suction nozzle and at upper and lower positions of the suction nozzle are inspected when the suction nozzle moves rotatively and vertically.

According to a fourth aspect of the present invention, there is provided a component mounting method according to the third aspect, wherein displacements of the suction nozzle tip surface at angles of rotation of 0 deg, 90 deg, 180 deg and 270 deg of the suction nozzle and at upper and lower positions of the suction nozzle are inspected when the suction nozzle moves rotatively and vertically.

According to a fifth aspect of the present invention, there is provided a component mounting method according to the third aspect, wherein the upper position of the suction nozzle is a position where the suction nozzle sucks a mountable component having a maximum component thickness, and the lower position of the suction nozzle is a position where the suction nozzle sucks no component.

According to a sixth aspect of the present invention, there is provided a component mounting method according to the first aspect, wherein the capturing, inspecting, and correcting are performed every time the suction nozzle sucks a component.

According to a seventh aspect of the present invention, there is provided a component mounting method according to the first aspect, wherein the rotary posture of the suction nozzle tip surface is captured by the image pickup device before the mounting of components onto the circuit board has begun. In addition, the displacement of the suction nozzle tip surface is inspected when the suction nozzle moves rotatively. Furthermore, the mounting position of the component is corrected in every mounting stage according to the displacement of the suction nozzle tip surface.

According to an eighth aspect of the present invention, there is provided a component mounting apparatus comprising: a component supply device having a plurality of component supply units; a circuit board positioning device for positioning at a specified position a circuit board on which a component is to be mounted; a mounting head provided with a head section which can be mounted with a suction nozzle and has a function of making the mounted suction nozzle move rotatively operating to suck to the suction nozzle a component from the component supply device and mount the component to the specified position on the circuit board; an image pickup device for capturing a rotary posture of a suction nozzle tip surface when the suction nozzle moves rotatively before the component is mounted onto the circuit board; a calculating section for obtaining a displacement of the suction nozzle tip surface when the suction nozzle moves rotatively based on the rotary posture captured by the image pickup device; and a control section for correcting the mounting position of the component in a mounting stage according to the displacement of the suction nozzle tip surface.

According to a ninth aspect of the present invention, there is provided a component mounting apparatus according to the eighth aspect, wherein the image pickup device captures rotary postures of a suction nozzle tip surface when the suction nozzle moves rotatively and vertically, before the component is mounted onto the circuit board. The calculating section obtains displacements of the suction nozzle tip surface when the suction nozzle moves rotatively and vertically.

According to a tenth aspect of the present invention, there is provided a component mounting apparatus according to the ninth aspect, wherein the calculating section obtains displacements of the suction nozzle tip surface at a plurality of angles of rotation of the suction nozzle. In addition, upper and lower positions of the suction nozzle are inspected when the suction nozzle moves rotatively and vertically.

According to an eleventh aspect of the present invention, there is provided a component mounting apparatus according to the tenth aspect, wherein the calculating section obtains displacements of the suction nozzle tip surface at angles of rotation of 0 deg, 90 deg, 180 deg and 270 deg of the suction nozzle. In addition, upper and lower positions of the suction nozzle are inspected when the suction nozzle rotatively and vertically moves.

According to a twelfth aspect of the present invention, there is provided a component mounting apparatus according to the tenth aspect, wherein the upper position of the suction nozzle is a position where the suction nozzle sucks a mountable component having a maximum component thickness, and the lower position of the suction nozzle is a position where the suction nozzle sucks no component.

According to a thirteenth aspect of the present invention, there is provided a component mounting apparatus according to the eighth aspect, wherein the control section controls operations of the image pickup device and calculating section so that the operations are performed every time the suction nozzle sucks a component.

According to a fourteenth aspect of the present invention, there is provided a component mounting apparatus according to the eighth aspect, wherein the image pickup device captures the rotary posture of the suction nozzle tip surface before the mounting of components onto the circuit board has begun. In addition, the calculating section obtains the displacement of the suction nozzle tip surface when the suction nozzle rotatively moves. Finally, the control section corrects the mounting position of the component in every mounting stage according to the displacement of the suction nozzle tip surface.

According to the above construction, by preparatorily measuring the displacement of the suction nozzle tip according to the bending of the shaft when the suction nozzle moves vertically or vertically and rotatively before the production of the circuit board, and by reflecting the measurement result in producing the circuit board, the mounting accuracy can be improved without any reduction in productivity due to the excessive vertical movement for the recognition at the same height as the mounting height.

According to the above construction, the apparatus can achieve a high mounting accuracy by implementing the above mounting method.

BRIEF DESCRIPTION OF THE DRAWINGS

These and other aspects and features of the present invention will become clear from the following description taken in conjunction with the preferred embodiments thereof with reference to the accompanying drawings, in which:

FIG. 10 is an explanatory view of an example of mounting data;

FIG. 11 is an explanatory view of an example of mark data;

DETAILED DESCRIPTION OF THE PREFERRED EMBODIMENTS

Figure 1:
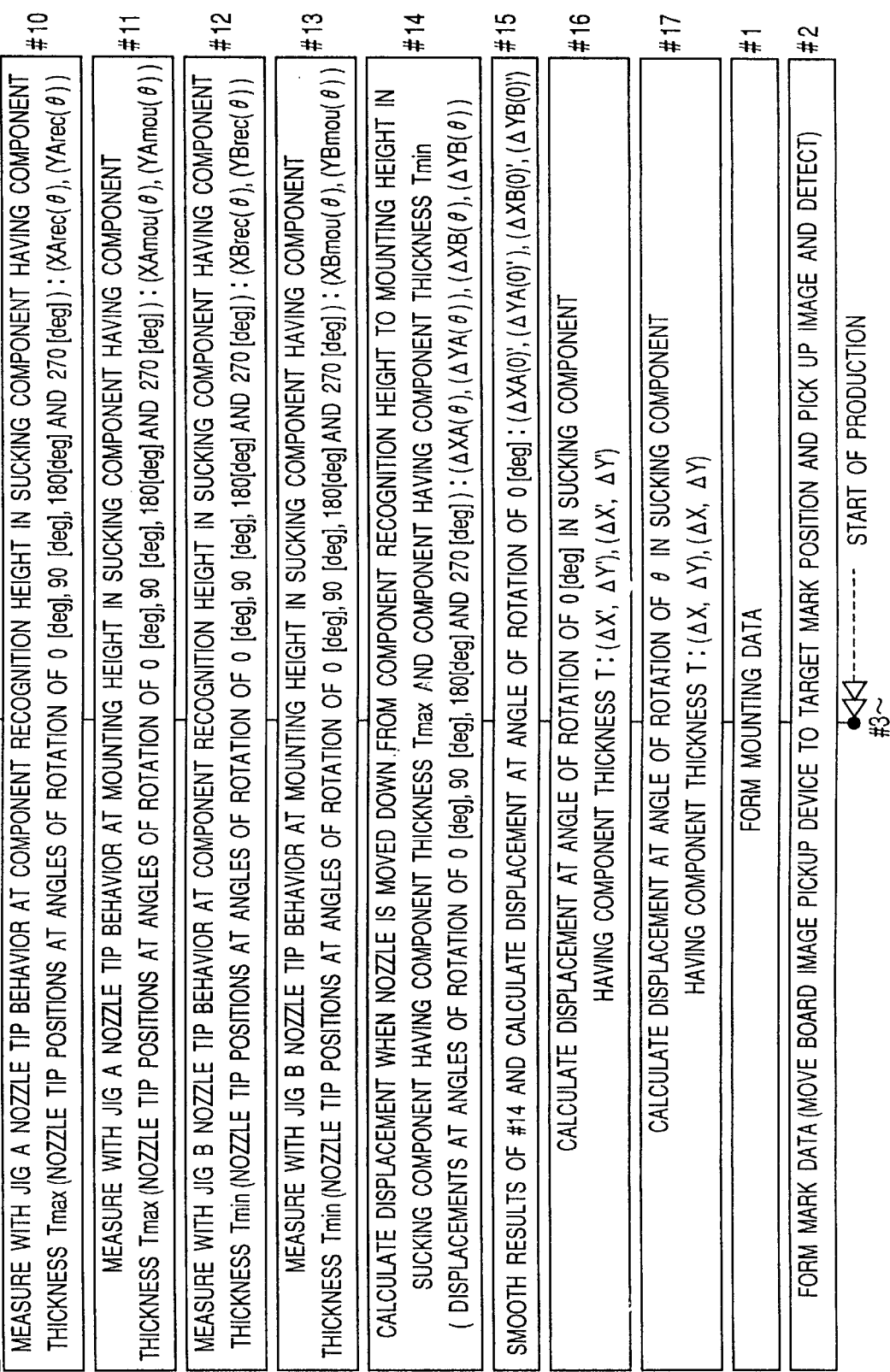
FIG. 1 is a flowchart of correction data forming a portion of a control sequence according to an embodiment of the electronic component mounting method of the present invention.

Before the description of the present invention proceeds, it is to be noted that like parts are designated by like reference numerals throughout the accompanying drawings.

Figure 12:
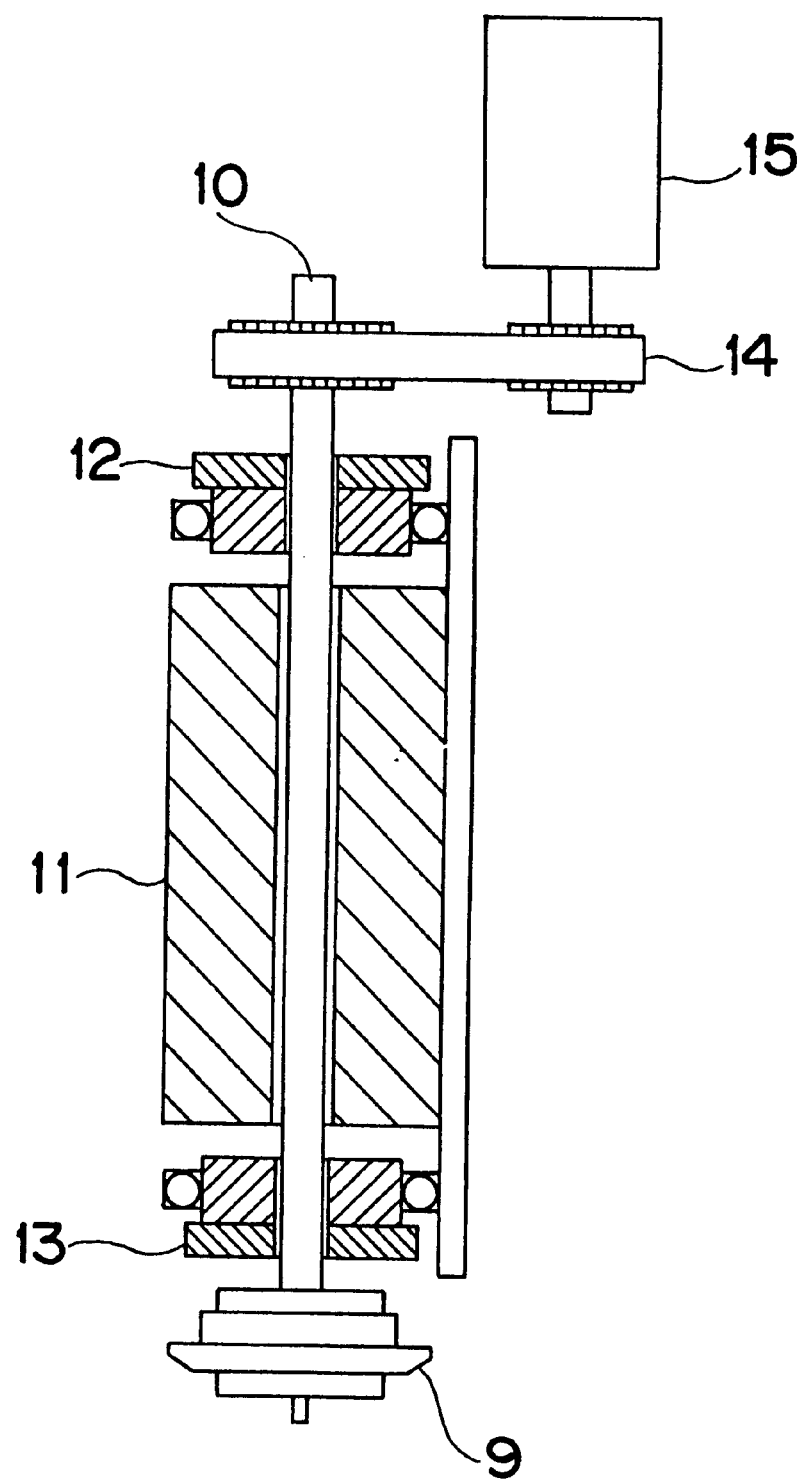
FIG. 12 is a schematic diagram of a suction nozzle vertical and rotative movement mechanism.
Figure 13:
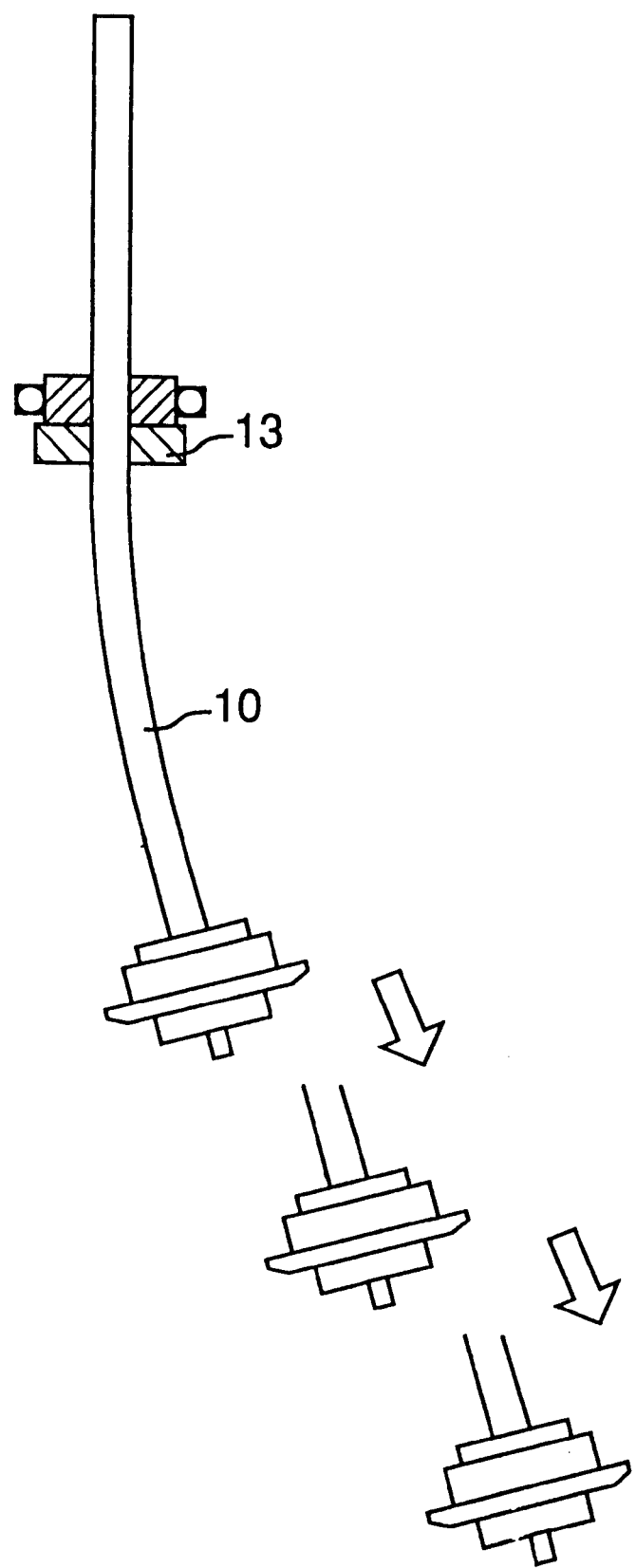
FIG. 13 is an explanatory view of a displacement attributed to shaft bending in the above embodiment.
Figure 14:
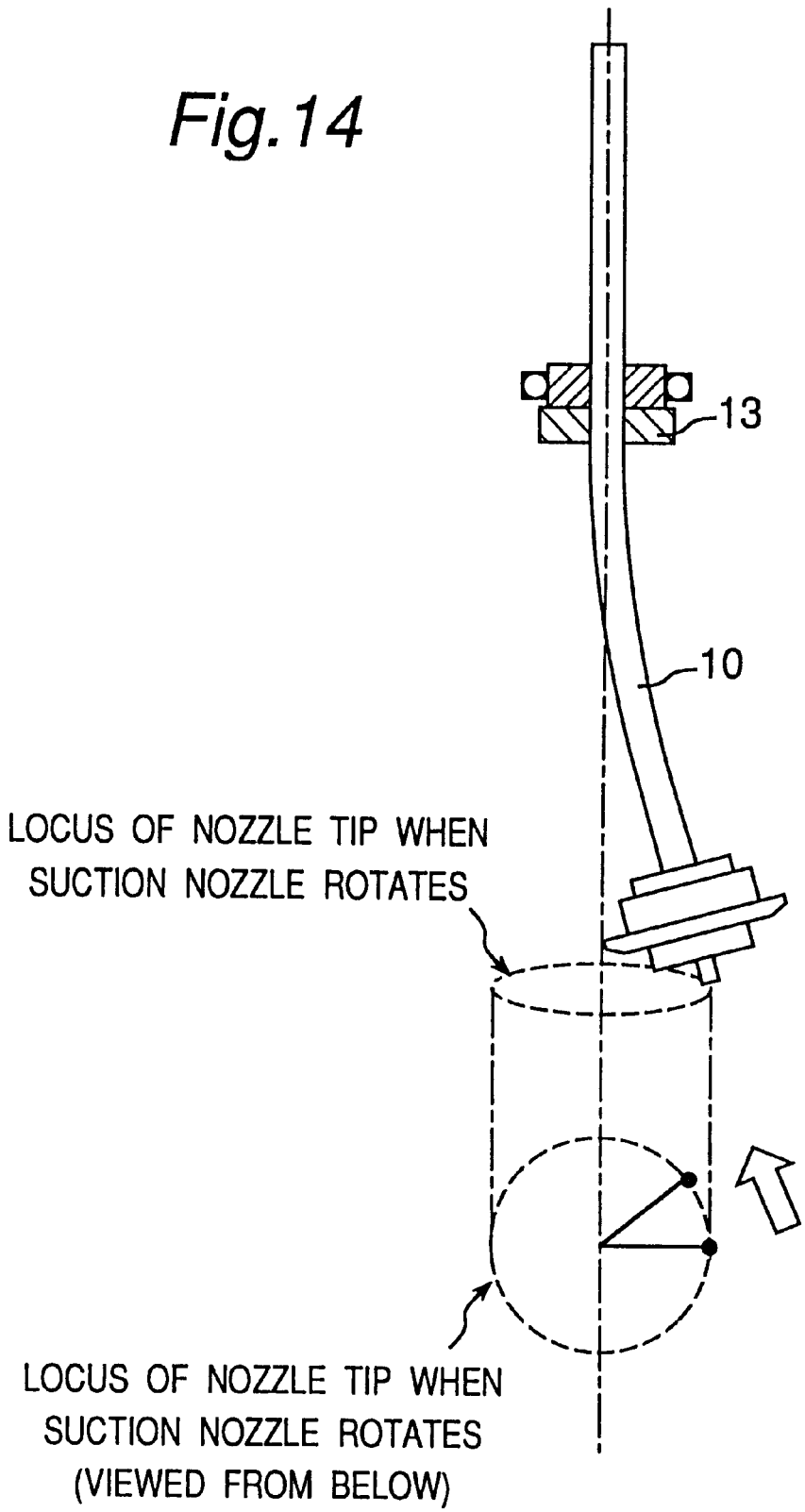
FIG. 14 is an explanatory view of a rotative displacement attributed to shaft bending in the above embodiment.

An electronic component mounting method and apparatus according to one embodiment of the present invention will be described below with reference to FIGS. 1 through 6. It is to be noted that the overall construction of the electronic component mounting apparatus and the component mounting head are almost similar to those described in connection with the prior art with reference to FIGS. 7 and 12, and the description for them should be referred to with no further description provided.

Figure 2:
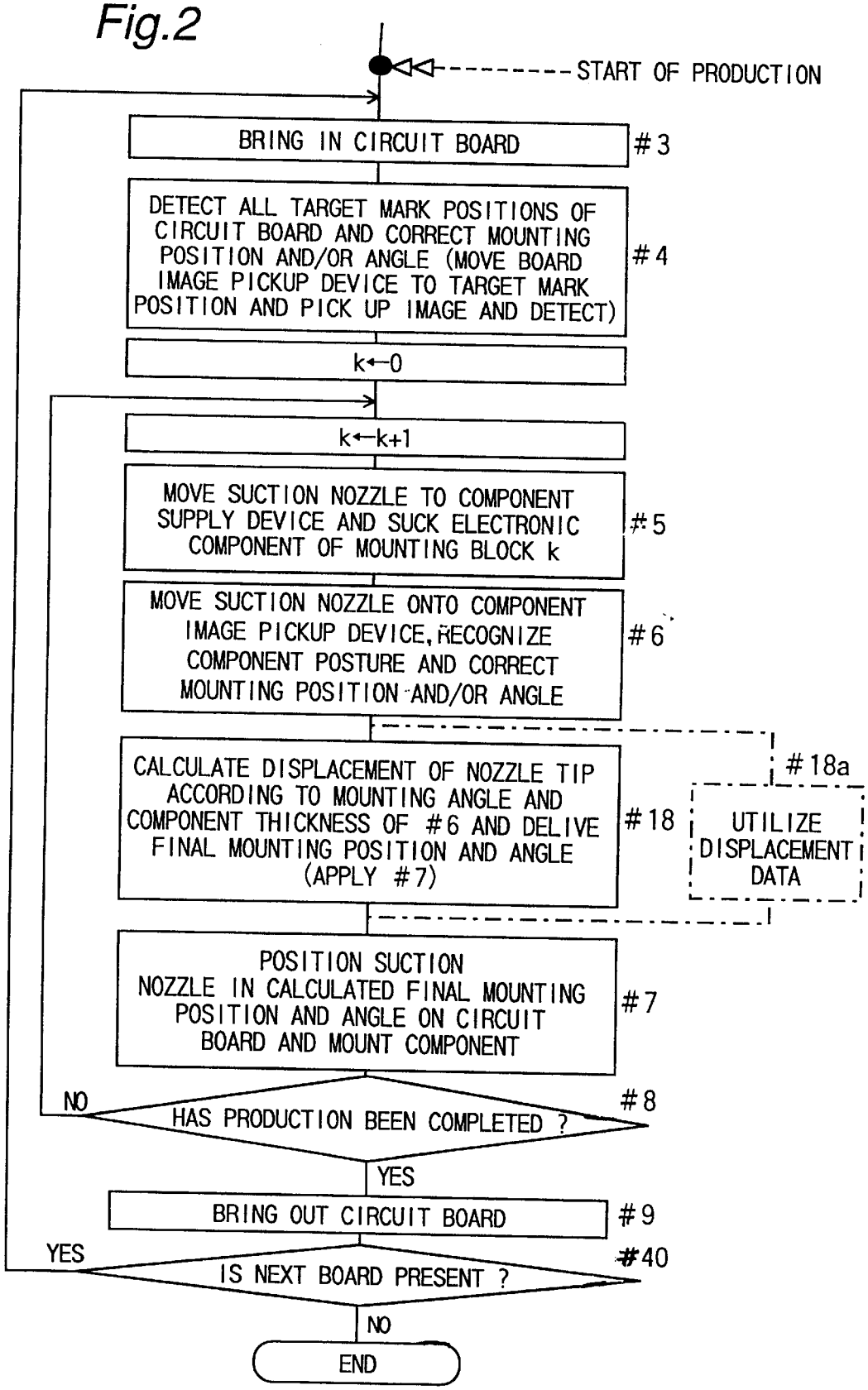
FIG. 2 is a flowchart of a production process portion of the above control sequence.

In the present embodiment, as shown in FIG. 1, prior to the production of the circuit board, the displacement of the suction nozzle tip due to the bending of the shaft when the suction nozzle moves vertically and rotatively is measured by, for example, obtaining a displacement between center positions obtained from an upper locus and a lower locus of the suction nozzle rotation. Thereafter the production of the circuit board is performed as shown in FIG. 2.

Figure 3:
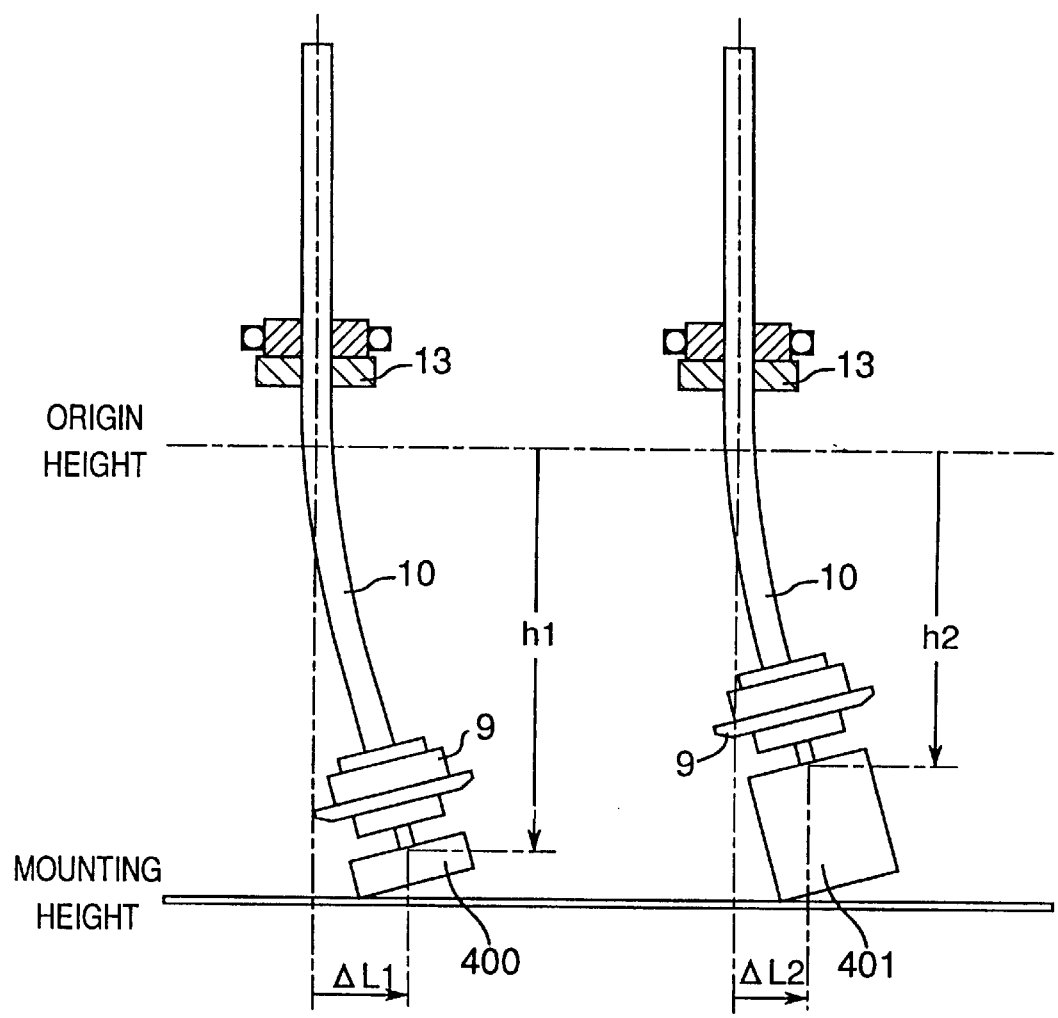
FIG. 3 is an explanatory view of the suction nozzle height and the amount of displacement according to the component thickness of an electronic component in the above embodiment.

As shown in FIG. 3, since the height at which the suction nozzle is moved down differs depending on the component thickness of the electronic component 400, 401 to be mounted, the thickness of each component is required to detect the displacement of the nozzle tip. Accordingly, for the purpose of simplifying the control in the present embodiment, the displacements of the nozzle tip in the case of a mountable maximum component thickness Tmax and in the case of a minimum component thickness Tmin (where no component is sucked, i.e., the component thickness is zero) are measured. A value linearly approximated from the displacement of the nozzle tip in the case of the component thickness Tmax and in the case of the component thickness Tmin is applied to the desired electronic component having a component thickness T.

Figure 4:
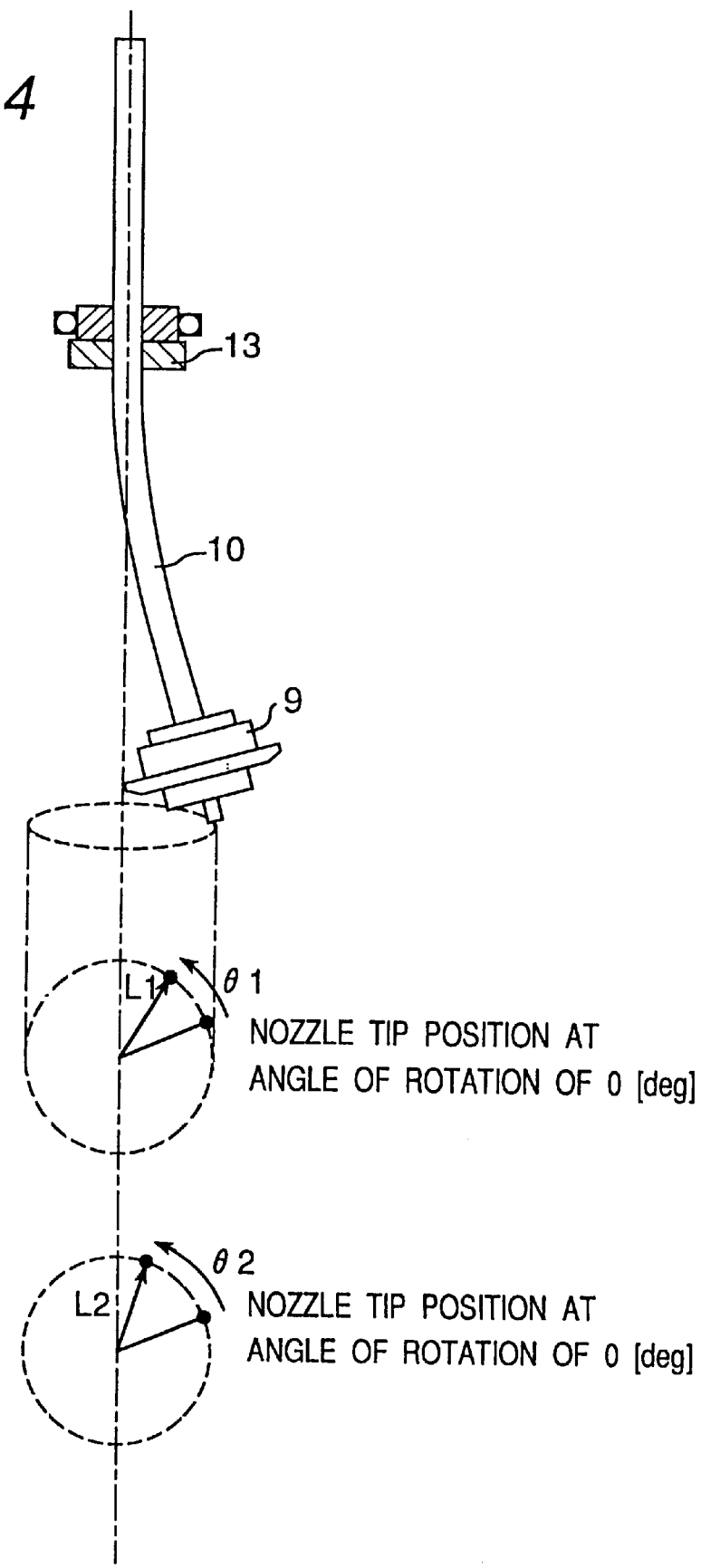
FIG. 4 is an explanatory view of the amount of displacement according to the angle of rotation of the suction nozzle in the above embodiment.

Further, as shown in FIG. 4, it is necessary to detect the displacement at every angle of rotation of the suction nozzle 9. In the present embodiment, for the purpose of simplifying the control method, the displacements of the nozzle tip at the angles of rotation of 0 deg, 90 deg, 180 deg and 270 deg of the suction nozzle 9 are measured, the displacement at the angle of rotation of 0 deg smoothed by averaging the measurement results is derived, and a value obtained by rotationally transforming the calculated displacement at the angle of 0 deg is applied to the case of a desired angle of rotation.

Figure 5:
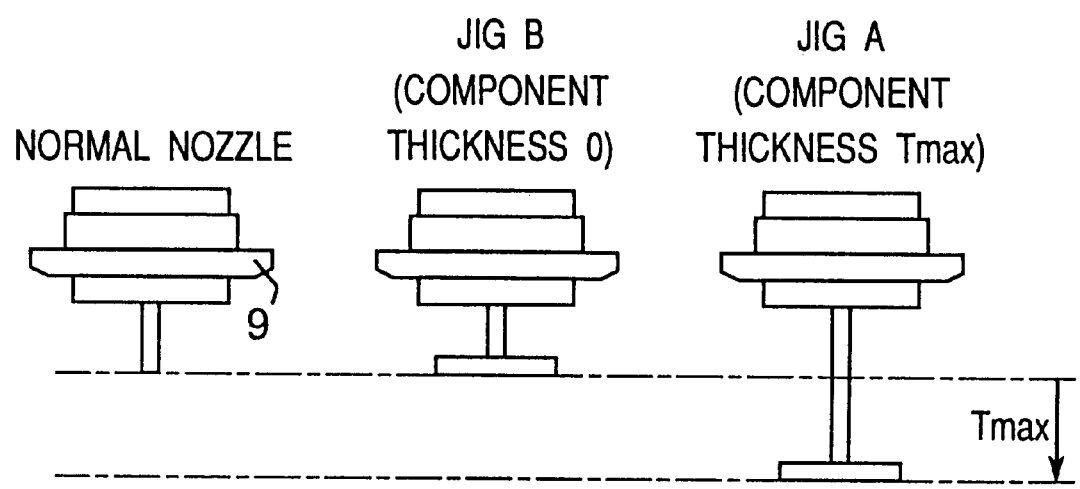
FIG. 5 is an explanatory view of jigs for use in the above embodiment.

For the measurement, as shown in FIG. 5, a jig A corresponding to the nozzle height in the case where an electronic component having a component thickness Tmax is sucked by the suction nozzle 9, and a jig B corresponding to the nozzle height in the case where an electronic component having a component thickness Tmin is sucked, are used. The nozzle tip position of the suction nozzle at the component recognition height is measured by the component image pickup device 16, and the nozzle tip position in the position of the mounting height is measured by the image pickup device 17 whose image pickup focal point is located at the mounting height.

The measurement procedure is to firstly mount the jig A on the desired head section and position the jig tip at the component recognition height. A tip position (Xarec($\theta$), Yarec($\theta$)) of the jig A at each of the angles of rotation of 0 deg, 90 deg, 180 deg and 270 deg is measured by the component image pickup device 16 (Step #10). Next, the jig tip is positioned at the mounting height, and a tip position (XAmou($\theta$), Yamou($\theta$)) of the jig A at each of the angles of rotation of 0 deg, 90 deg, 180 deg and 270 deg is measured by the image pickup device 17 (Step #11). In a similar manner, the jig B is mounted on the head section, and a tip position (Xbrec(θ), Ybrec(θ)) of the jig B at each of the angles of rotation of 0 deg, 90 deg, 180 deg and 270 deg is measured by the component image pickup device 16 (Step #12). Then, the jig tip is positioned at the mounting height, and a tip position (XBmou(θ), YBmou(θ)) of the jig B at each of the angles of rotation of 0 deg, 90 deg, 180 deg and 270 deg is measured by the image pickup device 17 (Step #13).

Next, nozzle tip, displacements ($\Delta XA$, (θ), $\Delta YA(\theta)$) and ($\Delta XB(\theta)$, $\Delta YB(\theta)$) in the case where the suction nozzle is moved down from the component recognition height to the mounting height at each of the angles of rotation of 0 deg, 90 deg, 180 deg and 270 deg are derived from the obtained measurement results for each of the component thickness Tmax (jig A) and the component thickness Tmin (jig B) according to the following equations (Step #14). In this case, different image pickup devices are used for the measurement of the component recognition height and the mounting height. Therefore, for the purpose of making the coordinate systems of the measurement results coincide with each other at each height, we have a consideration with the center position of the rotative movement of the suction nozzle, i.e., ($\Sigma\Delta XArec(\theta)/4$, $\Sigma\Delta YArec(\theta)/4$) and ($\Sigma\Delta XBrec(\theta)/4$, $\Sigma\Delta YBrec(\theta)/4$) at the component recognition height and ($\Sigma\Delta XAmou(\theta)/4$, $\Sigma\Delta YAmou(\theta)/4$) and ($\Sigma\Delta XBmou(\theta)/4$, $\Sigma\Delta Bmpu(\theta)/4$) at the mounting height, used as a reference.

[In the case of component thickness Tmax (jig A)]

$$\Delta XA(\theta)=(XAmou(\theta)-(\Sigma XAmou(\theta)/4))-(XArec(\theta)-(\Sigma XArec(\theta)/4)) \quad (1)$$

$$\Delta YA(\theta)=(YAmou(\theta)-(\Sigma YAmou(\theta)/4))-(YArec(\theta)-(\Sigma YArec(\theta)/4)) \quad (2)$$

[In the case of component thickness Tmin (jig B)]

$$\Delta XB(\theta)=(XBmou(\theta)-(\Sigma XBmou(\theta)/4))-(XBrec(\theta)-(\Sigma XBrec(\theta)/4)) \quad (3)$$

$$\Delta YB(\theta)=(YBmou(\theta)-(\Sigma YBmou(\theta)/4))-(YBrec(\theta)-(\Sigma YBrec(\theta)/4)) \quad (4)$$

Further, the smoothed displacements ($\Delta X'A(0)$, ($\Delta Y'A(0)$) and ($\Delta X'B(0)$, ($\Delta Y'B(0)$) in the case where the suction nozzle is moved down from the component recognition height to the mounting height at the angle of rotation of 0 deg are derived from the equations (1) through (4) for each of the component thickness Tmax (jig A) and the component thickness Tmin (jig B) according to the following equations (Step #15). It is to be noted that the values of ($\Delta XA(0)$, $\Delta YA(0)$) and ($\Delta XB(0)$, $\Delta YB(0)$) obtained from the aforementioned equations can also be used. However, the value obtained by smoothing the displacements of the nozzle tip at all the measured angles of rotation is used, taking into consideration the case where the nozzle tip does not describe a perfect circle with the rotation of the suction nozzle.

[In the case of component thickness Tmax (jig A)]

$$\Delta X'A(0)=\Delta XA(0)+(\Sigma\Delta XA(\theta)/4) \quad (5)$$

$$\Delta Y'A(0)=\Delta YA(0)+(\Sigma\Delta YA(\theta)/4) \quad (6)$$

[In the case of component thickness Tmin (jig B)]

$$\Delta X'B(0)=\Delta XB(0)+(\Sigma\Delta XB(\theta)/4) \quad (7)$$

$$\Delta Y'B(0)=\Delta YB(0)+(\Sigma\Delta YB(\theta)/4) \quad (8)$$

Figure 6A:
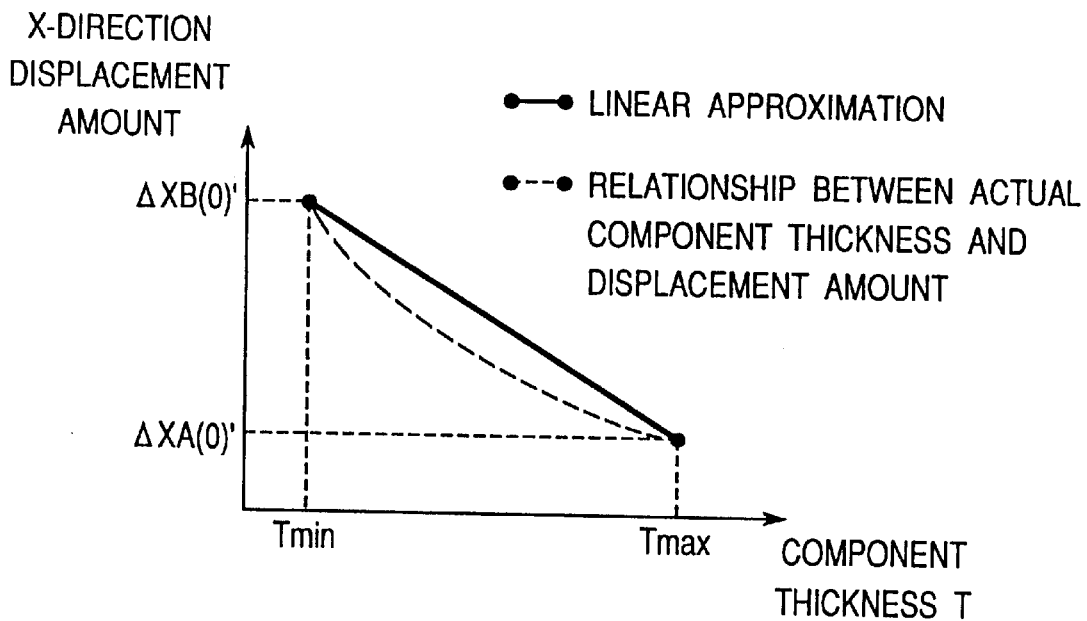
FIGS. 6A and 6B are graphs showing relationships between the component thickness and the nozzle tip displacement.
Figure 6B:
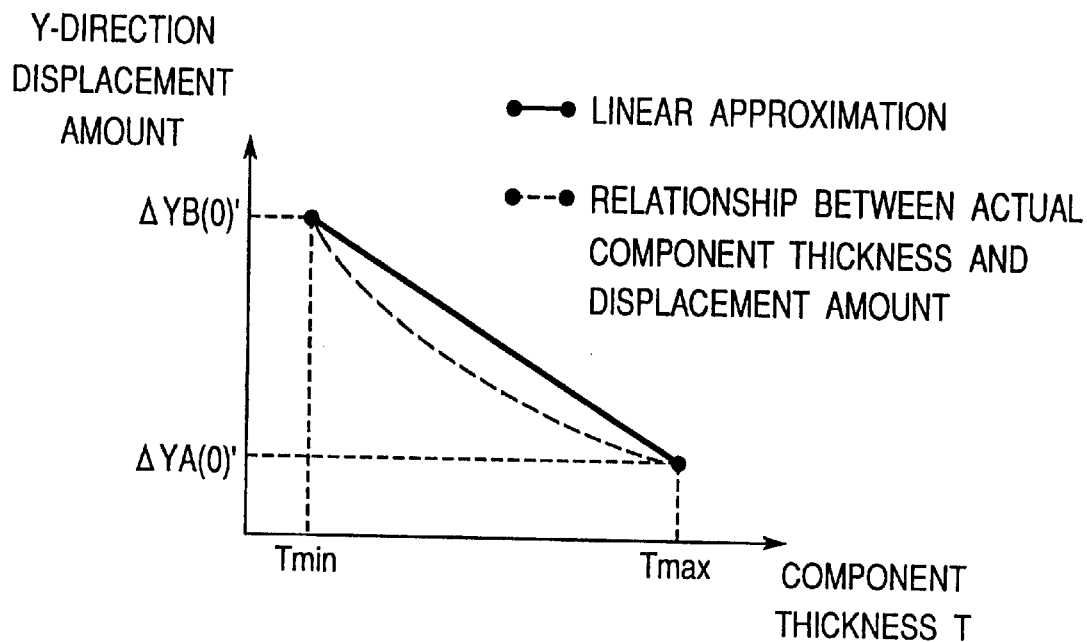
Figure 7:
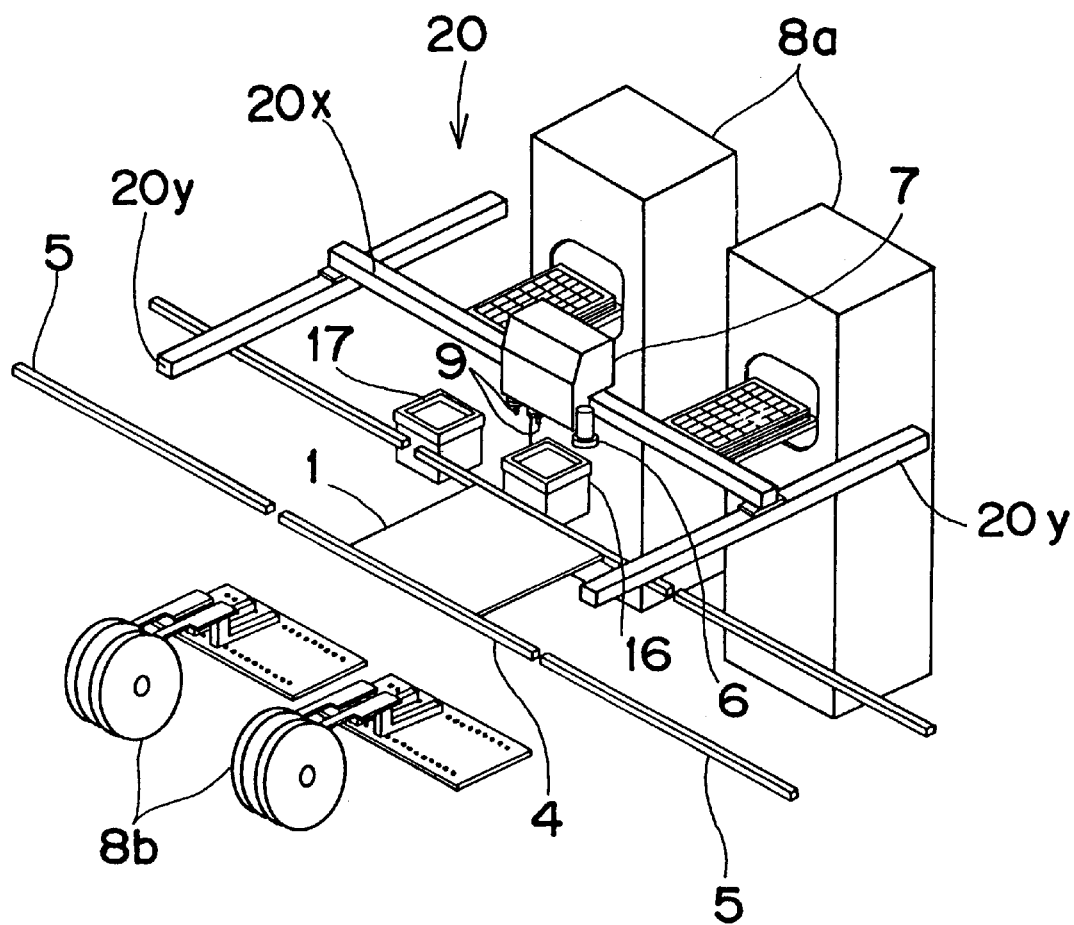
FIG. 7 is a perspective view showing the overall schematic construction of a prior art electronic component mounting apparatus.
Figure 8:
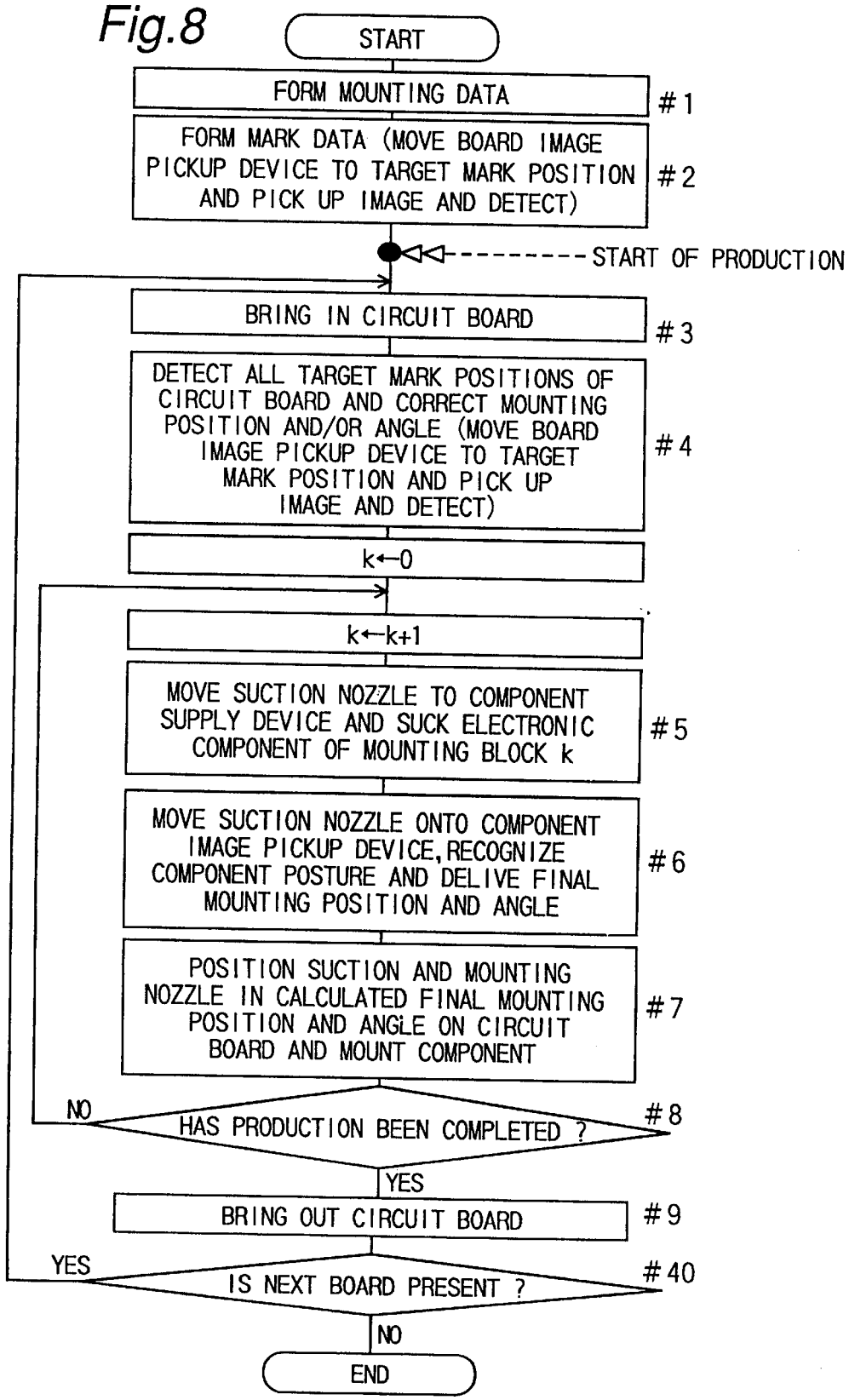
FIG. 8 is a flowchart of a control sequence according to an electronic component mounting method.
Figure 9:
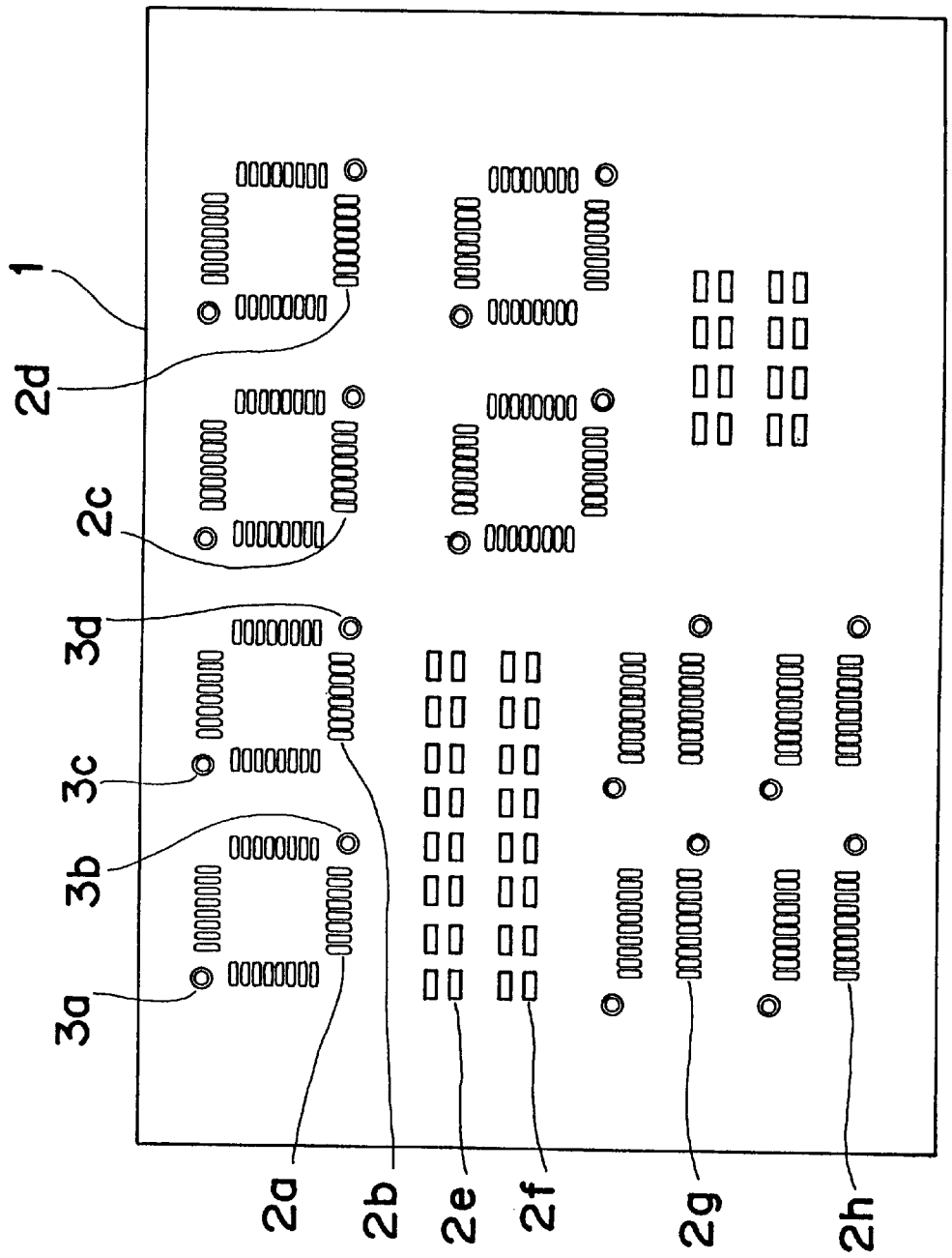
FIG. 9 is a plan view of an example of a circuit board.

Finally, FIGS. 6A, 6B are obtained from the equations (5) through (8), and the relationship of a displacement ($\Delta X'$, $\Delta Y'$) between the component thickness T and the nozzle tip at the angle of rotation of 0 deg of the suction nozzle is derived according to the following equations (Step #16).

$$\Delta X'=\Delta X'B(0)+\{(\Delta X'A(0)-\Delta X'B(0))/(Tmax-Tmin)\}\times(T-Tmin) \quad (9)$$

$$\Delta Y'=\Delta Y'B(0)+\{(\Delta Y'A(0)-\Delta Y'B(0))/(Tmax-Tmin)\}\times(T-Tmin) \quad (10)$$

Therefore, the displacement of the nozzle tip at the angle of rotation θ of the suction nozzle can be derived according to the following equations by rotationally transforming the displacement at the angle of rotation of 0 deg (Step #17).

$$\Delta X=\Delta X' \cos\theta-\Delta Y' \sin\theta \quad (11)$$

$$\Delta Y=\Delta X' \sin\theta-\Delta Y' \cos\theta \quad (12)$$

These values differ for every head, and therefore, all the heads are subjected to the same processing, thereby deriving a nozzle tip displacement ($\Delta Xi$, $\Delta Yi$) of the head i.

Next, the circuit board is produced by firstly forming mounting data from the mounting pattern of the circuit board to be produced before the start of the production similar to the prior art (Step #1), and by detecting a positional relationship between the mounting pattern and the target mark of the circuit board for reference use, thereby forming mark data (Step #2).

The subsequent processes in the production stage are similar to those of the prior art, and the processes will be described with reference to FIG. 2. First, the circuit board 1 to be produced is brought into the circuit board positioning device 4 (Step #3). Next, the board image pickup device 6 is aligned from above with the desired target mark 3a, 3b, 3c, etc. of the circuit board to pick up the image of the target mark, thereby detecting the target mark position of the circuit board. According to this image pickup result, the mounting position and the angle are corrected (Step #4).

Subsequently, the desired electronic component is sucked by the component supply device 8 at a mounting block k according to the preparatorily formed mounting data (Step #5). The suction posture of the sucked electronic component is then picked up by the component image pickup device 16, and the mounting position and the angle of the electronic component are corrected based on this image pickup result (Step. #6). The mounting block k is determined by inserting a value of "0" into "k" of the mounting block number and then adding "1" to the mounting block number "k" as shown in FIG. 2.

In this case, the suction nozzle is rotated to the mounting angle θ thereafter the suction nozzle is moved down for the mounting of the electronic component having the component thickness T on the circuit board. In this stage, the displacement ($\Delta Xi$, $\Delta Yi$) of the nozzle tip of the head i is derived from the aforementioned equations (11) and (12), thereby determining the final mounting position (Step #18). The electronic component is mounted onto the circuit board 1 according to the mounting position and the angle obtained through the above process after positioning the suction nozzle to the obtained mounting position and the angle (Step #7).

At this point of time, it is examined whether or not the production of the circuit board 1 has been completed (Step #8). When the production has been completed, the circuit board 1 is brought out of the circuit board positioning device 4 (Step #9). When the production has not been completed at Step #8, the sucking and mounting processes of the next electronic component are performed (Steps #5 through #7 and #18). Then, at Step #40, when a next circuit board to which components are to be mounted is present, the flow returns to Step #3. If no, the production is terminated.

According to the description of the aforementioned embodiment, based on the displacements of the nozzle tip in the case of the mountable maximum component thickness and that in the case where no component is sucked, i.e., the component thickness is zero, the displacement in the case of the electronic component having the desired component thickness T is linearly approximated. However, by applying a more precise approximation method or measuring the displacement of the nozzle tip having a more detailed component thickness instead of the linear approximation, the mounting accuracy can be further improved.

Furthermore, the displacement at the angle of rotation of 0 deg smoothed by averaging the displacements of the nozzle tip at the angles of rotation of 0 deg, 90 deg, 180 deg and 270 deg of the suction nozzle is derived, and the value obtained by rotationally transforming the derived displacement at the angle of 0 deg is applied to the case of the desired angle of rotation. However, by measuring the displacement of the nozzle tip at more detailed angles of rotation of the suction nozzle, or by storing the displacement data at every desired angle of rotation, the mounting accuracy can be further improved.

Figure 15:
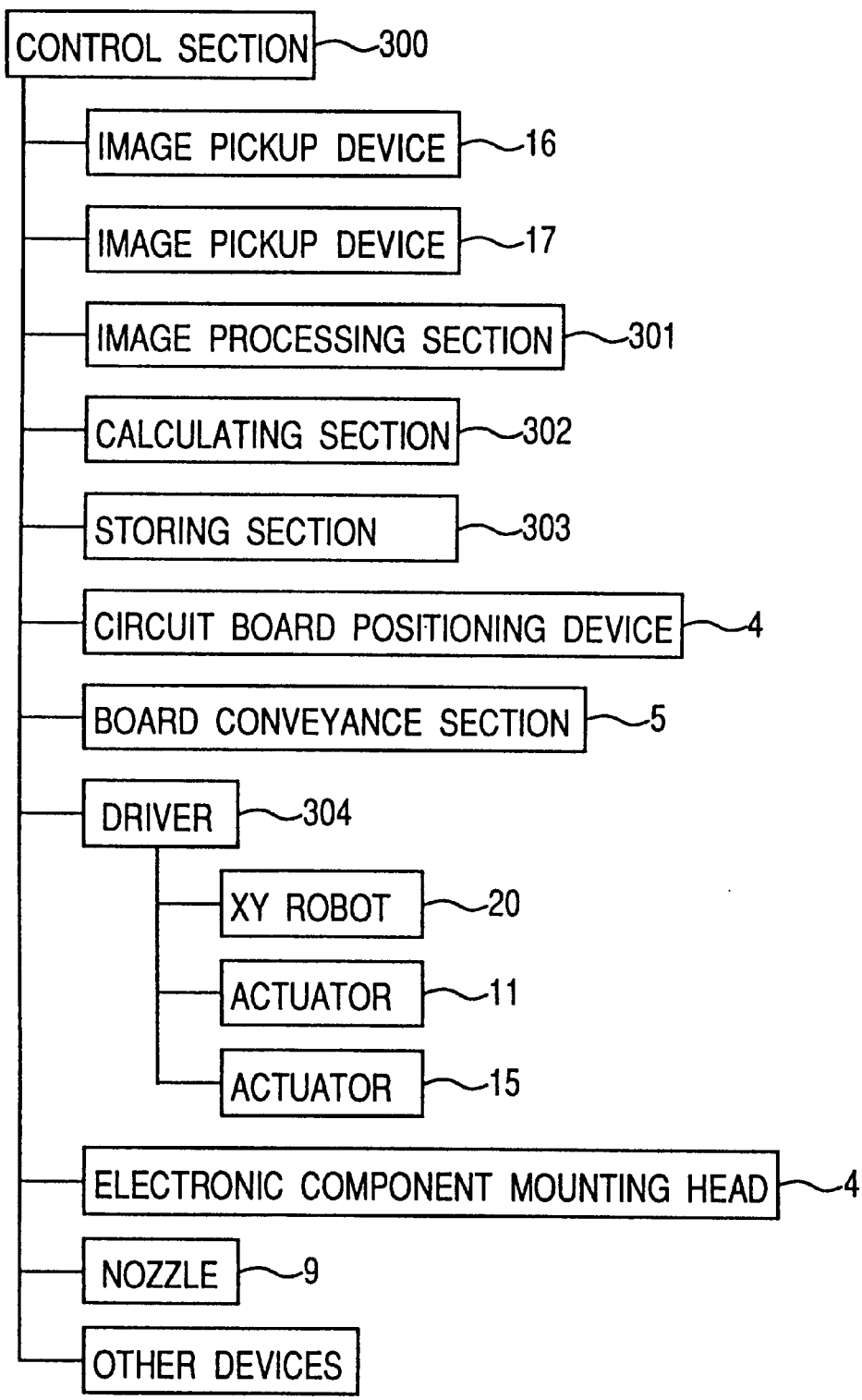
FIG. 15 is a schematic block diagram showing control section and calculating section etc. of the electronic component mounting apparatus for bringing out the method of the embodiment.

FIG. 15 is a schematic block diagram showing control section and calculating section etc. of the electronic component mounting apparatus for bringing out the method of the embodiment. That is, in FIG. 15, reference numeral 300 denotes a control section, 301 an image processing section, 302 a calculating section, 303 a storing section, and 304 a driver. The control section 300 is connected to the image pickup devices 16, 17, image processing section 301, calculating section 302, storing section 303, circuit board positioning device 4, driver 304, electronic component mounting head 7, and nozzle 9, etc. so as to control the above operations.

As described above in detail, the image pickup devices 16, 17 capture the images of the rotary postures of the suction nozzle tip surface when each of the suction nozzles 9 move rotatively and vertically (at least rotatively,) before the component is mounted onto the circuit board. The image processing section 301 performs image processing of the images obtained in the image pickup device 16, 17 and inputs the image-processed data into the storing section 303. The calculating section 302 calculates the displacement of the suction nozzle tip surface when the suction nozzle 9 moves rotatively and vertically (at least rotatively) based on the rotary posture images captured by the image pickup devices 16, 17 and stored in the storing section 303. Based on the calculated displacement, the control section 300 controls the operation of the driver 304 so that the driver 304 drives a suitable one of the XY robot 20 and actuators 11, 15 to correct the mounting position of the component in the mounting stage according to the displacement of the suction nozzle tip surface.

The control section 300 also controls the positioning operation of the circuit board positioning device 4, the bringing-in and bringing-out operations of the board conveyance section 5, the various operations of the head 7 and the sucking operations etc. of the nozzle 9 and the operations of other devices.

In the embodiment, as described above, the control section 300 can control operations of the image pickup devices 16, 17 and calculating section 302 so as to be performed every time the suction nozzle 9 sucks a component.

Instead, the control section 300 can control the following operation. That is, the image pickup devices 16, 17 capture the rotary postures of the suction nozzle tip surface before the process of mounting components onto the circuit board 10 begins. The calculating section 302 obtains the displacement of the suction nozzle tip surface when the suction nozzle 9 rotatively moves, and then inputs the displacement data into the storing section 303 for teaching operation. The control section 300 controls the driver 304 to correct the mounting position of the component in every mounting stage according to the displacements of the suction nozzle tip surface while utilizing the stored displacement data, without capturing the images and calculating the displacements every time the nozzle 9 sucks a component to be mounted, as shown in FIG. 2 by dashed lines as a teaching process at step #18a. That is, the displacement data obtained before the component mounting begins is utilized for correcting the mounting position of the component in every mounting stage without performing the process at step #18.

As is apparent from the above description, according to the electronic component mounting method and apparatus of the present invention, by deriving the displacement of the nozzle tip when the suction nozzle moves vertically and rotatively using the component thickness and the mounting angle prepared as parameters before the start of the production, and reflecting on the mounting position the displacement when the suction nozzle moves vertically and rotatively according to the component thickness and the mounting angle of the electronic component in the production stage, the mounting accuracy can be improved, so that a circuit board having a higher mounting can be produced.

The entire disclosure of Japanese Patent Application No. 9-158936 filed on Jun. 16, 1997, including the specification, claims, drawings, and summary are incorporated herein by reference in its entirety.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

We claim:
1. A component mounting apparatus comprising:
   a component supply device having a plurality of component supply units;
   a circuit board positioning device for positioning at a specified position a circuit board on which a component is to be mounted;
   a mounting head provided with a head section which can be mounted with a suction nozzle and has a function of making the mounted suction nozzle rotatively move, operating to suck to the suction nozzle a component from the component supply device and mount the component to the specified position on the circuit board;
   an image pickup device for capturing a rotary posture of a suction nozzle tip surface when the suction nozzle rotatively moves, before the component is mounted onto the circuit board;
   a calculating section for obtaining a displacement of the suction nozzle tip surface when the suction nozzle rotatively moves based on the rotary posture captured by the image pickup device; and
   a control section for correcting the mounting position of the component in a mounting stage according to the displacement of the suction nozzle tip surface.

2. A component mounting apparatus according to claim 1, wherein the image pickup device captures rotary postures of a suction nozzle tip surface when the suction nozzle rotatively and vertically moves, before the component is mounted onto the circuit board, and the calculating section obtains displacements of the suction nozzle tip surface when the suction nozzle rotatively and vertically moves.

3. A component mounting apparatus according to claim 2, wherein the calculating section obtains displacements of the suction nozzle tip surface at a plurality of angles of rotation of the suction nozzle and at upper and lower positions of the suction nozzle are inspected when the suction nozzle rotatively and vertically moves.

4. A component mounting apparatus according to claim 3, wherein the calculating section obtains displacements of the suction nozzle tip surface at angles of rotation of 0 deg, 90 deg, 180 deg and 270 deg of the suction nozzle and at upper and lower positions of the suction nozzle are inspected when the suction nozzle rotatively and vertically moves.

5. A component mounting apparatus according to claim 3, wherein the upper position of the suction nozzle is a position where the suction nozzle sucks a mountable component having a maximum component thickness and the lower position of the suction nozzle is a position where the suction nozzle sucks no component.

6. A component mounting apparatus according to claim 1, wherein the control section controls operations of the image pickup device and calculating section so as to be performed every time the suction nozzle sucks a component.

7. A component mounting apparatus according to claim 1, wherein the image pickup device captures the rotary posture of the suction nozzle tip surface before start of mounting components onto the circuit board;

the calculating section obtains the displacement of the suction nozzle tip surface when the suction nozzle rotatively moves; and the control section corrects the mounting position of the component in every mounting stage according to the displacement of the suction nozzle tip surface.

* * * * *

UNITED STATES PATENT AND TRADEMARK OFFICE
CERTIFICATE OF CORRECTION

| | |
|---|---|
| PATENT NO. | : 6,263,559 B1 |
| DATED | : July 24, 2001 |
| INVENTOR(S) | : Yoshihiro Mimura et al. |

It is certified that error appears in the above-identified patent and that said Letters Patent is hereby corrected as shown below:

Title page,
Item [56] References Cited; U.S. PATENT DOCUMENTS,
The U.S. Patent No. for the McConnell reference is listed incorrectly as being "4,628,646," and should be listed correctly as being -- 4,628,464 --.

Signed and Sealed this

Twelfth Day of March, 2002

*Attest:*

JAMES E. ROGAN
*Attesting Officer*   *Director of the United States Patent and Trademark Office*